(12) United States Patent
Urban

(10) Patent No.: US 9,233,843 B2
(45) Date of Patent: Jan. 12, 2016

(54) METHOD FOR MANUFACTURING A STRUCTURED SURFACE

(71) Applicant: Robert Bosch GmbH, Stuttgart (DE)

(72) Inventor: Andrea Urban, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/543,116

(22) Filed: Nov. 17, 2014

(65) Prior Publication Data

US 2015/0140717 A1    May 21, 2015

(30) Foreign Application Priority Data

Nov. 18, 2013    (DE) .......................... 10 2013 223 490

(51) Int. Cl.
*H01L 21/00* (2006.01)
*B81C 1/00* (2006.01)
*B81C 99/00* (2010.01)

(52) U.S. Cl.
CPC ......... *B81C 1/00857* (2013.01); *B81C 1/00388* (2013.01); *B81C 1/00531* (2013.01); *B81C 99/0025* (2013.01)

(58) Field of Classification Search
CPC ................ H01L 21/0217; H01L 21/02274; H01L 21/0228; H01L 21/30625; H01L 21/67017; H01L 21/76898; H01L 23/50; H01L 27/092; H01L 21/02013; H01L 21/02024; H01L 21/02211; H01L 21/02222; H01L 21/02271
USPC .............. 257/415, 639, 774, E21.24, E29.09; 438/50–51, 400, 494, 689, 710, 725
See application file for complete search history.

(56) References Cited

U.S. PATENT DOCUMENTS

2003/0190807 A1* 10/2003 Soda et al. ..................... 438/689
2009/0117388 A1*  5/2009 Nakanishi et al. ............ 428/413

FOREIGN PATENT DOCUMENTS

DE           4241045         5/1994

* cited by examiner

*Primary Examiner* — Mark A Laurenzi
(74) *Attorney, Agent, or Firm* — Kenyon & Kenyon LLP

(57) ABSTRACT

A method is described for manufacturing a micromechanical structure, in which a structured surface is created in a substrate by an etching method in a first method step, and residues are at least partially removed from the structured surface in a second method step. In the second method step, an ambient pressure for the substrate which is lower than 60 Pa is set and a substrate temperature which is higher than 150° C. is set.

14 Claims, 5 Drawing Sheets

METHOD FOR MANUFACTURING A STRUCTURED SURFACE

FIELD OF THE INVENTION

The present invention is directed to a method for manufacturing a structured surface on a substrate. Such three-dimensional structures are of interest in the semiconductor and MEMS industries in particular, to implement, for example, preferably installation space-saving rotation rate sensors or acceleration sensors or other micromechanical sensors and components such as microphones or micromirrors, for example.

BACKGROUND INFORMATION

Plasma etching methods in which anisotropic etching is carried out in a targeted manner are known from the related art. In particular, German Published Patent Application No. 42 41 045 describes a method for anisotropic etching of silicon, in which etching and passivation steps are carried out separately in alternation (silicon trench etching). However, silicon is etchable with a more or less great anisotropy using a mixture of etching and passivation gases with the aid of continuous nonalternating plasma etching. In the trench etching process, a Teflon-type polymer, which functions to protect the Si side walls and is, in the plasma made of $C_x(H)F_y$-containing gases such as $C_4F_8$, $C_3F_8$, $C_2F_6$, $CHF_3$, $C_2H_2F_2$, for example, deposited on the substrate alternating between the $SF_6$ etching steps. The Teflon-type polymer layer permits anisotropic plasma etching of silicon since it is removed only at locations at which the ion incidence from the plasma takes place perpendicularly onto the wafer surface, i.e., on the mask and at the base of the etching trenches. The polymer layer remains essentially preserved on the silicon side walls, where there is no ion incidence, and thus protects the silicon side wall. In trench etching, the Teflon-type polymer protective layer remains on the silicon side walls at the end of the trench etching process. Photoresists typically function as a mask material in trench etching, which are stripped off in commercial plasma strippers in an $O_2$ plasma after the trench process.

Furthermore, plasma etching methods for structuring oxides or nitrides which are etched with the aid of $C_x(H)F_y$ gases are known from the related art. Gases of this type have a more or less strong polymerizing effect, depending on the C:F ratio. The higher the C:F ratio, the greater the tendency to polymerization. An H content acts like an increase in C:F ratio. The result of these plasma etching processes may depend on the extent to which the polymer residues created by the plasma etching method remain behind and in particular may be removed from the substrate having the structured surface. In particular the methods known from the related art do not appear suitable for all geometric conditions because the reactive particles or wet etching solutions required for removal in the plasma may not be able to penetrate so deeply into the trench structures (at high aspect ratios or with narrow gaps) or into undercuts or caverns created during etching. Even in the case of a MEMS polymer sacrificial layer, which is known from the related art, penetration of the reactive particles or wet etching solution to remove same in narrow dimensions and with further underetching is increasingly difficult. In addition, the structured surfaces are often shaped in such a way that the areas of the substrate having the residues after plasma etching are inaccessible for an ion incidence and therefore removal is difficult or even prevented.

SUMMARY

The object of the present invention is to "clean up" polymers which remain after the plasma structuring on surfaces, such as side walls, flanks, undercuts or caverns, from silicon trench etching processes and/or plasma etching processes of dielectrics such as oxide and/or nitride. For some applications, polymer residues on MEMS components result in an impairment of their function. Furthermore, polymers from previous processing steps may have negative effects on subsequent steps in processing MEMS substrates (for example, adhesion problems with layers deposited subsequently or outgassing in subsequent steps). Polymers are thus often problematical and must be removed.

The $O_2$ plasma stripping described above is the state of the art in semiconductor and MEMS technology for removing and cleaning up residues from previous process steps and/or installations. It is usually carried out in combination with wet cleaning steps.

Both these methods have in common the fact that it is difficult in general to adequately penetrate into narrow trenches with these media under these process conditions. This is due to the low mean free path length in stripping processes in the typical Torr pressure range or due to the inadequate penetration of wet etching solutions or to inadequate rinsing of solutions in the subsequent rinsing steps, when wet etching medium which has penetrated cannot be rinsed out because of capillary forces. This method is preferably universal, i.e., residues are removed from the substrate, regardless of the shape of the surface structure of the substrate, i.e., regardless of the geometric conditions and the properties of the substrate, even in narrow structures with a high aspect ratio and regardless of the shape of the surfaces to be cleaned, i.e., trenches of any shape, more or less steep side walls, etching points, undercuts or caverns. Furthermore, the plasma etching method described here is also suitable as a method for etching MEMS polymer sacrificial layers such as polyimide, for example. In addition, there is also interest in implementing the completion of the substrate having the structured surface with preferably little complexity.

This object is achieved by a method for manufacturing a micromechanical structure, a structured surface being created by an etching method in the substrate in a first method step. The etching method causes residues, which remain in the structured surface of the substrate. In a second method step, the residues are removed from the substrate and an ambient pressure for the substrate, which is preferably lower than 60 Pa, and a substrate temperature, which is preferably higher than 150° C., are set during the second method step.

The present invention has the advantage over the related art in that, because of the low pressure, the particles, which are free radicals in the plasma, for example, and are responsible for the removal of the residues from the structured surface of the substrate, are capable of penetrating much deeper into the narrow structures created with their high aspect ratio than the same particles at a higher pressure. These residues are preferably polymer residues, in particular $C_xF_y$ polymers, which remain on the surfaces in plasma etching with the aid of $C_x(H)F_y$ process gases. The present invention in particular does not use wet etching. Furthermore, the high temperature, which under some circumstances does not necessitate any further activation energy, i.e., only a low activation energy, is necessary for the reaction of these particles with the residues. Therefore, no ion incidence from a plasma is necessary to permit removal of the residues. The latter is advantageous in particular if the residues cannot be reached by ion incidence, as is the case with a cavity structured into the substrate, for example. The method according to the present invention has the advantage of being universally usable and independent of the created shape of the structured surface when the issue is to remove the residues from the structured surface. The present invention is aimed in particular at implementing micromechanical structures without any residues remaining from the first method step, so these micromechanical structures remain functional, despite very deep and narrow trenches (high aspect ratio) because the residues created by the first etching method have been successfully removed from them in a second method step.

This is preferably a micromechanical structure, which functions at least partially as a micromechanical component, for example, as an acceleration sensor or a rotation rate sensor or as a microphone or micromirror. It is also conceivable for the substrate to include printed conductors, electrodes and/or evaluation devices. Printed conductors, electrodes and/or evaluation devices are preferably at least partially exposed by the etching process.

In another specific embodiment, it is provided that in the second method step, the ambient pressure is lower than 60 Pa, preferably lower than 2 Pa or particularly preferably between 0.6 Pa and 1.3 Pa, and/or the substrate temperature is higher than 150° C., preferably higher than 190° C. or particularly preferably between 200° C. and 400° C. The substrate temperature is selected in particular in such a way that advantageously no damage occurs to the micromechanical structure due to the substrate temperature.

In another specific embodiment, it is provided that a plasma is used at least partially to remove the residues, the plasma containing at least partially $O_2$, $H_2$, $N_2$, forming gas ($H_2$ in $N_2$) or ammonia. Such reaction gases may be used in particular in clean form or in any mixing ratio. In particular the addition of $H_2$ to $O_2$ advantageously facilitates incineration of the residues, in particular the polymer residues, and thus also the removal of the residues. Furthermore, such a mixture advantageously results in reduction of $SiO_2$ formed on silicon surfaces during an $O_2$ plasma step. In a third method step, reduction of $SiO_2$ on silicon surfaces may advantageously be achieved in a pure $H_2$ plasma step, for example. This yields the advantage that silicon surfaces, which are completely free of residues and free of oxide at the same time, are implementable.

In another specific embodiment of the present invention, it is provided that $O_2$, $H_2$, $N_2$, forming gas or ammonia is added during the second method step. Different reaction gases are preferably added in alternation. Therefore, the removal of the residues may be adapted advantageously to the substrate, so that a preferably economical and/or extensive removal of residues is implementable.

In another specific embodiment, it is provided that the substrate includes a sacrificial layer, the sacrificial layer being removed at least partially during the second method step. In particular it is provided that the sacrificial layer is exposed in the first method step and both residues and parts of the sacrificial layer are removed in the second method step. Therefore, cavities and/or undercuts are easily implemented, for example. In particular this yields the advantage that the residues and parts of the sacrificial layer may be removed in one method step, so that the total complexity for manufacturing the micromechanical structure is reduced advantageously.

In another specific embodiment of the present invention, it is provided that the substrate is made of silicon, an oxide, a metal or a nitride. The substrate preferably includes a plurality of different materials and the removal of the residues may nevertheless take place advantageously in one method step.

In another specific embodiment of the present invention, it is provided that an etching mask is situated on the substrate chronologically prior to the first method step and the etching mask is removed chronologically after the first method step. The etching mask preferably includes a photoresist. In addition, the etching mask is designed in such a way that the etching mask essentially shows the parts of the substrate which are to be etched in the first method step. The structuring of the surface of the substrate in the first method step may therefore be facilitated in an advantageous manner.

In another specific embodiment, it is provided that the etching mask is removed with the aid of an oxygen plasma in a third method step or in the second method step. The etching mask is preferably removed together with the residues in a shared second method step. Therefore, an additional method step, in which only the etching mask is removed, may be omitted in an advantageous manner. However, it is also conceivable for the removal of the residues and removal of the etching mask to be carried out independently of one another under some circumstances to improve the success of the removal of residues and of the etching mask. Success is to be understood as the quantity of residues or of etching mask remaining behind on the substrate after removal by the second or third method step. The success of removal is greater when fewer residues or parts of the etching mask remain behind.

In another specific embodiment, it is provided that the substrate is situated in a plasma during the first method step and/or the second method step, the plasma being created by a high-frequency/low-frequency or microwave discharge. This yields the advantage of implementing a surface structure for the substrate or removal of residues in a particularly simple and accurate manner. In particular the required activation energy for a reaction may be made available in the plasma due to the ion incidence and/or the temperature and/or the process pressure, the reaction being necessary for the etching and/or removal of the etching mask and/or removal of the residues.

In another specific embodiment of the present invention, it is provided that in the first method step, the structured surface is manufactured by a reactive ion deep etching. In particular in the first method step, a method for anisotropic etching is used, an etching step and a polymerization step being carried out separately and alternately in succession in the method for anisotropic etching. In addition, it is conceivable that an etching gas is used for etching, such as $SF_6$, for example. Particularly narrow and deep surface structures may be implemented in the substrate by reactive ion deep etching in an advantageous manner.

In another specific embodiment of the present invention, it is provided that the first method step and the second method step are carried out in a device for creating a structured surface of the substrate. This makes it possible to save time in an advantageous manner, which would otherwise be required for transport of the substrate between the first method step and the second method step. Furthermore, this makes it possible to avoid investment in additional systems engineering.

Another subject matter is a device for manufacturing a surface-structured substrate and for removing residues from the surface structure, the device being designed in such a way that an ambient pressure for the substrate is settable, the ambient pressure being lower than 60 Pa, and a substrate temperature of the substrate is settable, the substrate temperature being higher than 150° C.

Such a device has the advantage over the related art that the first and second method steps may be carried out in a device and that residues may be removed preferably universally from the structured surface through the second method step. In this case, the device differs in particular from the related art, which knows primarily plasma devices for removing etching masks and polymer residues, which operate at high temperatures and high pressures or those that are operated at low pressures and low temperatures or use wet etching solutions as an alternative to plasma devices.

DETAILED DESCRIPTION

Figure 1:
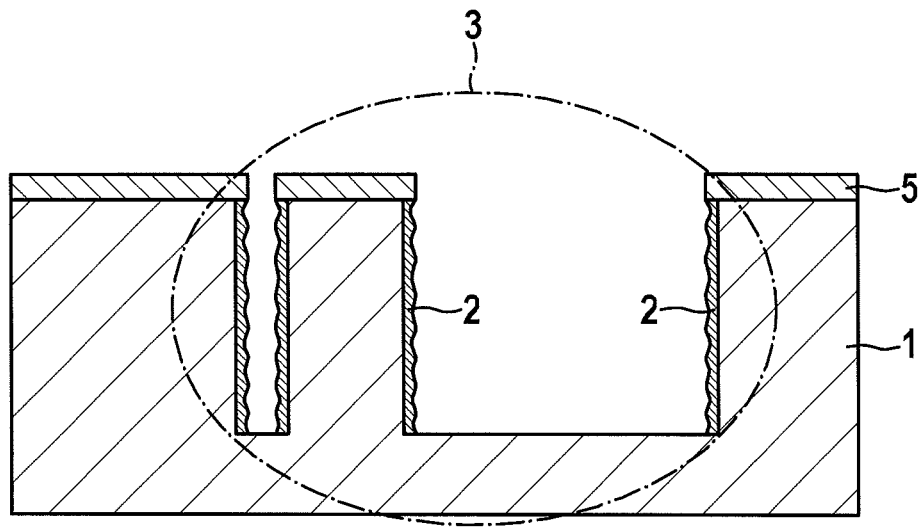
FIG. 1 shows a substrate having a first exemplary structured surface after a first method step according to a first specific embodiment.

The same parts in the various figures are always labeled with the same reference numerals and therefore are generally mentioned or cited only once.

FIG. 1 shows a substrate 1 after its surface has been structured by a plasma etching method in a first method step. The goal is to implement a preferably installation space-saving surface structure which may be used for a micromechanical device or component, for example. Therefore, in a method step carried out prior to the first method step, an etching mask 5 was applied to the side of substrate 1 which is to be structured. Typically in a plasma etching method, ions are advanced toward the surface, preferably being accelerated, and thus make available the activation energy required for the chemical reaction of the etching process. In particular the required plasma is generated from an etching gas by a high-frequency discharge or a microwave discharge. The etching gas is sulfur hexafluoride, for example. The passivating gas includes in particular $C_x(H)F_y$-containing gases such as $C_4F_8$, $C_3F_8$, $C_2F_6$, $CHF_3$ or $C_2H_2F_2$, for example. Substrate 1 preferably still functions as an electrode, so that ions of the plasma are able to move toward substrate 1 and an etching step thereby caused is at least partially directed at the substrate. However, to implement narrow and deep trenches having a high aspect ratio, a method is usually carried out in which an etching step and a polymerization step are carried out separately and in alternation. In the polymerization step, the entire surface area of the substrate is typically covered with a Teflon-type passivation. This passivation layer is usually removed in the subsequent etching step where the ion incidence from the plasma onto the substrate takes place perpendicularly, i.e., on the mask and at the etching base of the structures. The passivation thus remains on the side walls and therefore at the locations on the substrate in the direction of which the subsequent etching step should not perform any etching. Therefore, particularly narrow structures may be created in a silicon substrate 1, for example. In substrate 1 illustrated here having the first exemplary structured surface, this is a silicon substrate on whose side walls a Teflon-type polymer was deposited to protect them from the subsequent etching steps, thereby enabling anisotropic plasma etching of silicon since the Teflon-type polymer layer is removed only at those locations where the ion incidence runs perpendicularly to the surface of substrate 1 (i.e., on the etching mask and at the base of the etching trench caused by the preceding etching steps). In the absence of a polymer layer, the silicon would react spontaneously with fluorine radicals in the plasma, i.e., reacting purely chemically, so that the substrate would be etched completely isotropically, whereby fluorine radicals in plasma excitation of an $SF_6$ gas in the etching step are released. Although there is the possibility of performing anisotropic etching without a polymer layer on the side walls of the trenches within the scope of a cryoetching method, this would require temperatures lower than −120° C. to suppress the general isotropic reaction of the fluorine radicals with the silicon and a targeted activation of the reaction by perpendicular ion incidence from the plasma onto the substrate surface. Such a method is implementable only with a disproportionately great effort. Standard sealing ring materials of plasma etching systems become brittle at such low temperatures and lose their sealing effect. Photoresist masks do not withstand these low temperatures, become fragile and thus lose at least some of their protective effect against an etching attack on the substrate, which is beneath the mask and is to be protected. Since the substrate in cryoetching is the coldest part within the plasma etching chamber, there is the risk of condensation of constituents out of the process chamber on the substrate surface, which results in micromasking and in the worst case a complete failure of the etching progress. Therefore structured surfaces in substrates 1 are preferably implemented with a Teflon-type polymer layer, the Teflon-type polymer layer remaining behind as a residue on the silicon side walls after the first method step. For certain applications, this residue has a detrimental effect on the functionality and/or on further processability. To obtain a functional surface of substrate 1, which is structured in the first method step, in these cases, the residues created as part of the first method step must be removed from the structured surface. For cleaning, the related art knows wet methods or other methods, which cannot readily insure the removal of residues 2 out of structured surface 3 at high aspect ratios.

Figure 2:
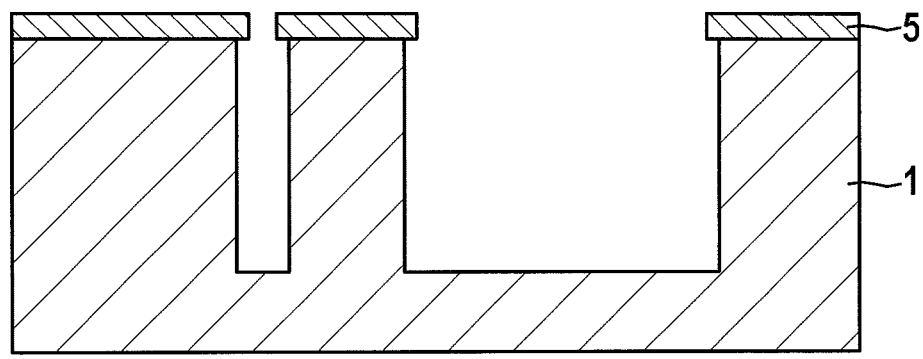
FIG. 2 shows a substrate having the first exemplary structured surface after the second method step according to a first specific embodiment.

FIG. 2 shows substrate 1 having the first exemplary structured surface after the second method step. After this second method step, substrate 1 in the specific embodiment illustrated here still has an etching mask 5 but there are no residues 2 formed by the plasma etching during the first method step. In particular the side walls of the wide and narrow trench are free of residues 2. For removing residues 2, it is provided that an ambient pressure below a first threshold value is established for substrate 1 and a temperature higher than a second threshold value is established. Thanks to the low pressure, it is advantageously possible for the reactive particles in the plasma which are responsible for removal of the residues to enter narrow structures, side walls, flanks, undercuts and/or cavities or caverns. This is made possible by mean free path length $\bar{l}$ according to $$\bar{l} = \frac{kT}{\pi\sqrt{2}\,d^2 p},$$

where k is the Boltzmann constant, d is the diameter of the reactive particle and p is the gas pressure. At 250° C. and an ambient pressure of 7.5 Torr, a mean free path length of approximately 11.28 cm is obtained for oxygen radicals in the plasma, having a diameter of 120 pm. This mean path length is 200 times greater than that in an $O_2$ stripping method at an ambient pressure of 1.5 Torr, such as that known from the related art. This reduces the probability of recombination of the reactive radical with other particles of the plasma by collisions and enables penetration into narrow structures, undercuts and cavities. At the same time, the high temperature has the advantage of providing an activation energy for the substance conversion even at locations where there is no ion incidence from the plasma. The pressure is advantageously between 0.6 Pa and 1.3 Pa, and the substrate temperature is between 150° C. and 400° C. The present invention thus differs from the related art, in which either the ambient pressure and the substrate temperature are both very high (for example, commercial $O_2$ plasma stripper: 250° C. and 200 Pa) or each is very low (for example, RIE or decoupled plasma etching systems: 20° C. and 26 Pa). It is provided in particular that through a suitable choice of substrate temperature and ambient pressure, removal is implementable, regardless of the shape and geometric ratios of the structured surface of the substrate.

Figure 3:
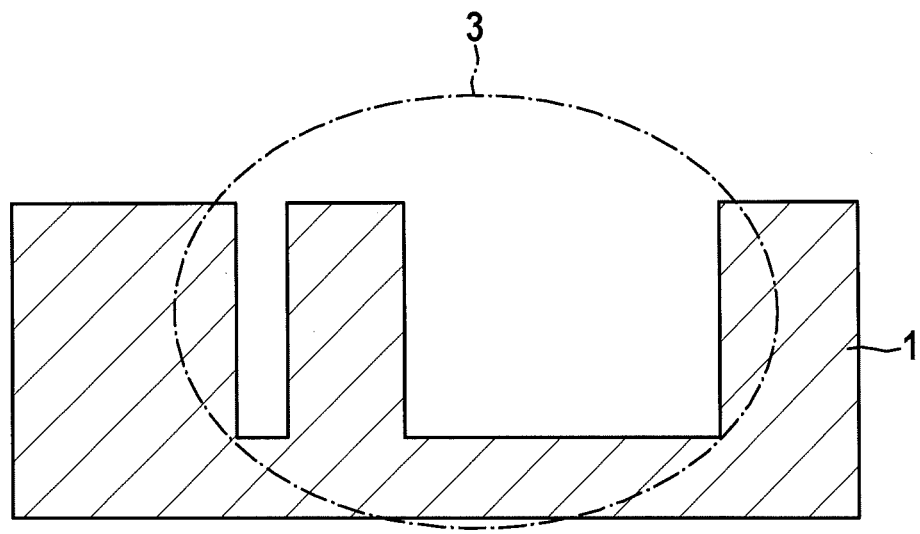
FIG. 3 shows a substrate having the first exemplary structured surface after the second method step according to a second specific embodiment.

FIG. 3 shows the substrate having the first exemplary structured surface after the second method step without an etching mask. Photoresists are typically used as the material for the etching mask, which defines the shape along which the substrate is to be structured. It is preferably provided that the etching mask is removed simultaneously with removal of the residues in the second method step. Such an incineration of the etching mask during removal of the residues has the advantage that an additional method step may be omitted, thus making it possible to reduce the time and effort involved in manufacturing the substrate having the structured surface.

Figure 4:
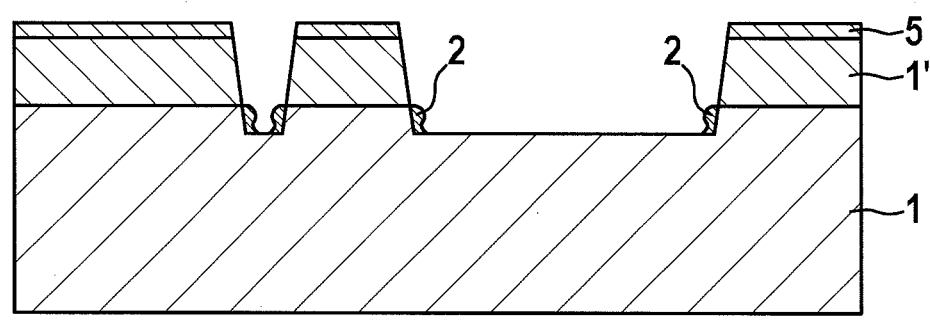
FIG. 4 shows a substrate having a second exemplary structured surface after a first method step according to the present invention.

FIG. 4 shows a substrate having a second exemplary structured surface. The substrate shown in FIG. 4 in particular includes an oxide layer or a nitride layer. Oxide or nitride layers are etched, for example, under ion bombardment by a plasma from gases containing $C_x(H)F_y$, i.e., from one of the following etching gases, for example: $C_4F_8$, $C_3F_8$, $C_2F_6$, $CHF_3$, $C_2H_2F_2$ or $CF_4$. Plasma etching of oxides and nitrides typically takes place only at locations where the reactive particles from the plasma of the aforementioned etching gases are reacted under ion bombardment with the oxide or nitride layer, and the resulting reaction products are desorbed from the structured surface. A spontaneous reaction of the etching gases as in etching of silicon in the presence of fluorine radicals generally does not occur in plasma etching of oxide or nitride layers. In particular, a much higher energy is required in etching of oxide or nitride layers to activate an etching reaction, the increased energy demand typically being implementable by a corresponding increase in ion bombardment. Since ion incidence cannot occur on the side faces, flanks and in particular on undercuts or in cavities, residues resulting from the more or less great tendency of the aforementioned etching gases to polymerize may also collect there. In particular the polymerization tendency increases with an increase in the C:F ratio. Furthermore, a hydrogen content in the etching gas has the same effect as an increase in the C:F ratio.

Figure 5:
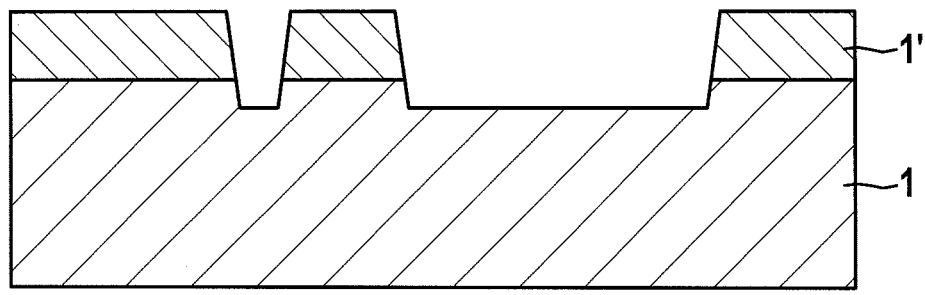
FIG. 5 shows a substrate having a second exemplary structured surface after a second method step according to the present invention.

FIG. 5 shows the substrate having the second exemplary structured surface after the second method step, whereby the residues were removed and at the same time the etching mask was removed or incinerated in the second method step according to the present invention.

In particular FIG. 5 shows that multilayer substrates may also be structured.

Figure 6:
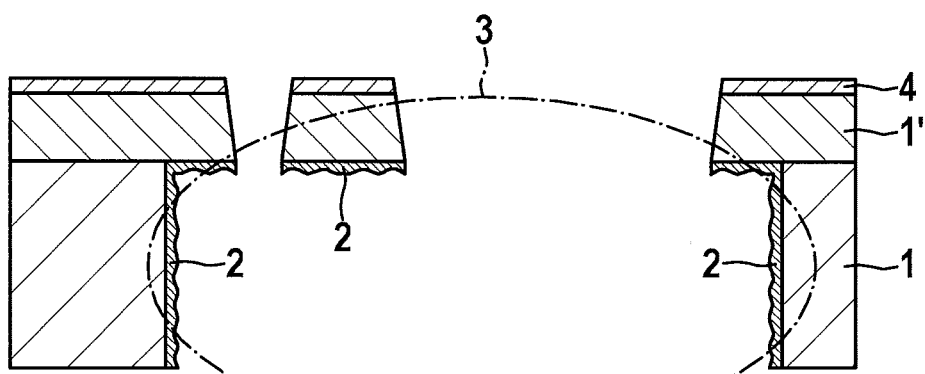
FIG. 6 shows a substrate having a third exemplary structured surface after a first method step according to the present invention.

FIG. 6 shows a substrate having a third exemplary structured surface. The substrate shown in FIG. 6 includes a cavity or a cavern chronologically after the first method step, where residues accumulate on the side walls as well as on the undersides of structures of the cavity or cavern. These locations cannot be reached by ion bombardment or ion incidence. In addition, the substrate may include a metal mask or an oxide mask or a combination of the two as the etching mask.

Figure 7:
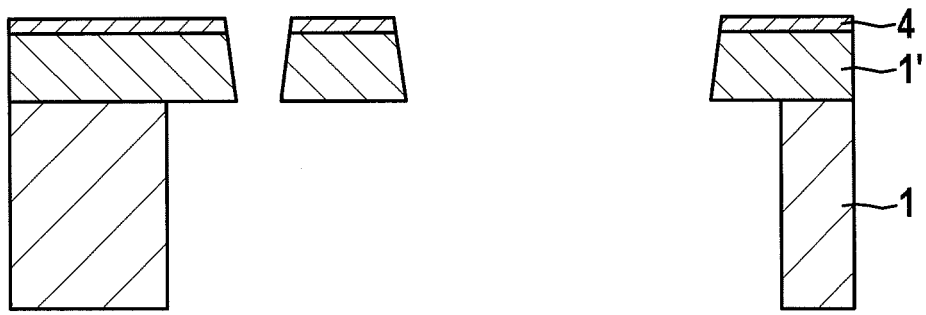
FIG. 7 shows a substrate having a third exemplary structured surface after a second method step according to the present invention.

FIG. 7 shows a substrate having the third exemplary structured surface after the second method step. This shows that residues may also be removed by the second method step from those areas of the substrate which cannot be reached by ion bombardment or ion incidence. It is provided in particular that during the second method step, the substrate temperature does not exceed 400° C. to prevent the metal of the etching mask from melting in the case of an aluminum layer, for example.

Figure 8:
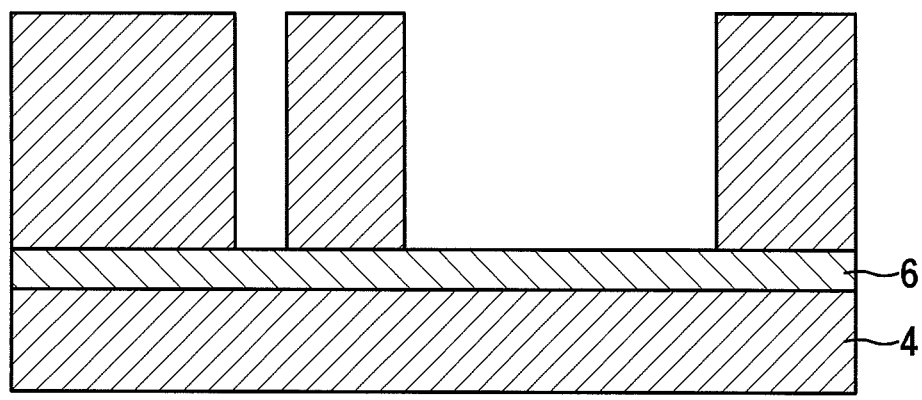
FIG. 8 shows a substrate having a fourth exemplary structured surface and a sacrificial layer.

FIG. 8 shows a substrate having a fourth exemplary structured surface and having an integrated sacrificial layer. This is a polymer sacrificial layer in particular. It is provided that at least some areas of the integrated sacrificial layer here are exposed in the first method step by a plasma etching method or a wet etching method.

Figure 9:
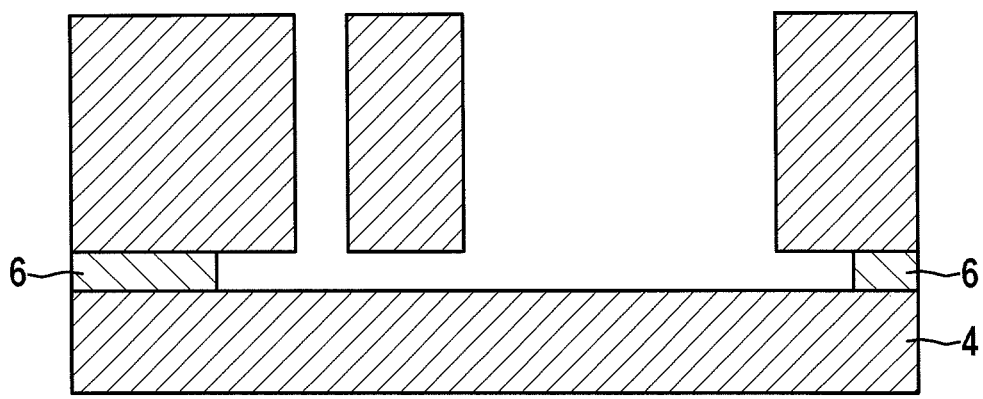
FIG. 9 shows a substrate having a fourth exemplary structured surface and a partially removed sacrificial layer.

FIG. 9 shows the substrate having the fourth exemplary structured surface and having an integrated sacrificial layer after the second method step. Due to the high substrate temperature and the low ambient pressures, it is possible to remove the sacrificial layer at least partially in the second method step. In particular cavities and undercuts may be implemented in this way without at least partially removing the sacrificial layer in a complex additional method step. In particular installation space-saving structures, which may become a part of an acceleration sensor or rotation rate sensor or some other micromechanical component or sensor element may be implemented in this way.

What is claimed is:

1. A method for manufacturing a micromechanical structure, comprising:
   creating a structured surface in a substrate by an etching method; and
   at least partially removing residues from the structured surface;
   during the removing step, setting an ambient pressure for the substrate that is lower than 60 Pa and setting a substrate temperature that is higher than 150° C., wherein $O_2$, $H_2$, $N_7$, forming gas or ammonia is supplied during the removing step.

2. The method as recited in claim 1, wherein in the removing step at least one of:
   the ambient pressure is lower than 3 Pa, and
   the substrate temperature is higher than 175° C.

3. The method as recited in claim 1, wherein the ambient pressure is lower than 2 Pa.

4. The method as recited in claim 1, wherein the ambient pressure is between 0.6 Pa and 1.3 Pa.

5. The method as recited in claim 1, wherein the substrate temperature is higher than 190° C.

6. The method as recited in claim 1, wherein the substrate temperature is between 200° C. and 400° C.

7. The method as recited in claim 1, wherein a plasma is used at least partially to remove the residues, the plasma at least partially containing $O_2$, $H_2$, $N_2$, forming gas or ammonia.

8. The method as recited in claim 1, wherein the substrate includes a sacrificial layer that is removed at least partially during the removing step.

9. The method as recited in claim 1, wherein the substrate includes at least partially one of silicon, an oxide, a metal, and a nitride.

10. The method as recited in claim 1, wherein chronologically prior to the creating step an etching mask is situated on the substrate and chronologically after the creating step the etching mask is removed.

11. The method as recited in claim 10, wherein the etching mask is removed with the aid of an oxygen plasma.

12. The method as recited in claim 1, wherein the substrate is situated in a plasma during at least one of the creating step and the removing step, the plasma being created by one of a high frequency discharge, a low frequency discharge, and a microwave discharge.

13. The method as recited in claim 1, wherein the structured surface is manufactured by reactive ion deep etching in the creating step.

14. The method as recited in claim 1, wherein the creating step and the removing step are carried out in a device for creating a structured surface on the substrate.

* * * * *